United States Patent
Lin et al.

(10) Patent No.: US 11,034,859 B2
(45) Date of Patent: Jun. 15, 2021

(54) BARRIER RUTHENIUM CHEMICAL MECHANICAL POLISHING SLURRY

(71) Applicant: FUJIFILM ELECTRONIC MATERIALS U.S.A., INC., North Kingstown, RI (US)

(72) Inventors: David (Tawei) Lin, Chandler, AZ (US); Bin Hu, Chandler, AZ (US); Liqing (Richard) Wen, Mesa, AZ (US); Yannan Liang, Gilbert, AZ (US); Ting-Kai Huang, Taiwan (CN)

(73) Assignee: FUJIFILM ELECTRONIC MATERIALS U.S.A., INC., North Kingstown, RI (US)

( * ) Notice: Subject to any disclaimer, the term of this patent is extended or adjusted under 35 U.S.C. 154(b) by 0 days.

(21) Appl. No.: 16/298,505

(22) Filed: Mar. 11, 2019

(65) Prior Publication Data
US 2019/0300749 A1    Oct. 3, 2019

Related U.S. Application Data

(60) Provisional application No. 62/649,324, filed on Mar. 28, 2018.

(51) Int. Cl.
*C09G 1/02* (2006.01)
*H01L 21/321* (2006.01)
(Continued)

(52) U.S. Cl.
CPC .............. *C09G 1/02* (2013.01); *B24B 1/00* (2013.01); *B24B 37/044* (2013.01); *C09G 1/00* (2013.01);
(Continued)

(58) Field of Classification Search
None
See application file for complete search history.

(56) References Cited

U.S. PATENT DOCUMENTS

| 5,968,408 A * | 10/1999 | Anderson | C23F 11/149 |
| | | | 252/180 |
| 2001/0029705 A1 * | 10/2001 | Miyata | C09G 1/02 |
| | | | 51/308 |

(Continued)

FOREIGN PATENT DOCUMENTS

| CN | 1306517 A | 8/2001 |
| CN | 101205442 A | 6/2008 |

(Continued)

OTHER PUBLICATIONS

International Search Report dated May 30, 2019 for PCT application No. PCT/US2019/021624.

(Continued)

*Primary Examiner* — Jiong-Ping Lu
(74) *Attorney, Agent, or Firm* — Ohlandt, Greeley, Ruggiero and Perle, LLP

(57) ABSTRACT

A slurry for polishing surfaces or substrates that at least partially comprise ruthenium and copper, wherein the slurry includes an alkali hydroxide, oxygenated halogen compound, and a halogen alkyl benzotriazole. The slurry may further include abrasive, acid(s), and, optionally, an alkoxylated alcohol. With these components, the slurry exhibits a high ruthenium to copper removal rate ratio.

32 Claims, 1 Drawing Sheet

(51) Int. Cl.
- C09K 3/14 (2006.01)
- C09G 1/06 (2006.01)
- C09K 13/06 (2006.01)
- C09G 1/04 (2006.01)
- B24B 1/00 (2006.01)
- C09G 1/00 (2006.01)
- B24B 37/04 (2012.01)
- H01L 21/306 (2006.01)

(52) U.S. Cl.
CPC .............. *C09G 1/04* (2013.01); *C09G 1/06* (2013.01); *C09K 3/1454* (2013.01); *C09K 3/1463* (2013.01); *C09K 13/06* (2013.01); *H01L 21/30625* (2013.01); *H01L 21/3212* (2013.01)

(56) References Cited

U.S. PATENT DOCUMENTS

| | | |
|---|---|---|
| 2004/0159234 A1 | 8/2004 | Bernards et al. |
| 2005/0003746 A1* | 1/2005 | Fujii ................. C09G 1/02 451/41 |
| 2005/0282387 A1 | 12/2005 | Sato et al. |
| 2006/0160475 A1 | 7/2006 | Ma et al. |
| 2006/0163083 A1 | 7/2006 | Andricacos et al. |
| 2007/0128872 A1 | 6/2007 | Itoh et al. |
| 2008/0148649 A1* | 6/2008 | Liu .................... C09G 1/02 51/298 |
| 2008/0254628 A1 | 10/2008 | Boggs et al. |
| 2017/0009101 A1 | 1/2017 | Yasui |
| 2017/0081553 A1* | 3/2017 | Tamada ............ H01L 21/30625 |
| 2018/0002571 A1 | 1/2018 | Stender et al. |

FOREIGN PATENT DOCUMENTS

| | | |
|---|---|---|
| KR | 100648555 B1 | 11/2006 |
| KR | 1020080058242 A | 6/2008 |
| TW | 422876 B | 2/2001 |
| TW | 201512382 A | 4/2015 |

OTHER PUBLICATIONS

Written Opinion dated May 30, 2019 for PCT application No. PCT/US2019/021624.

Taiwan Office Action with Search Report dated Dec. 27, 2019 for Taiwan application No. 108109823.

Korean Office Action dated Aug. 10, 2020 for Korean application No. 10-2019-0035905.

Chinese Office Action dated Aug. 31, 2020 for Chinese application No. 201910221524.6.

International Preliminary Report on Patenability (IPRP) dated Sep. 29, 2020 for PCT application No. PCT/US2019/021624.

* cited by examiner

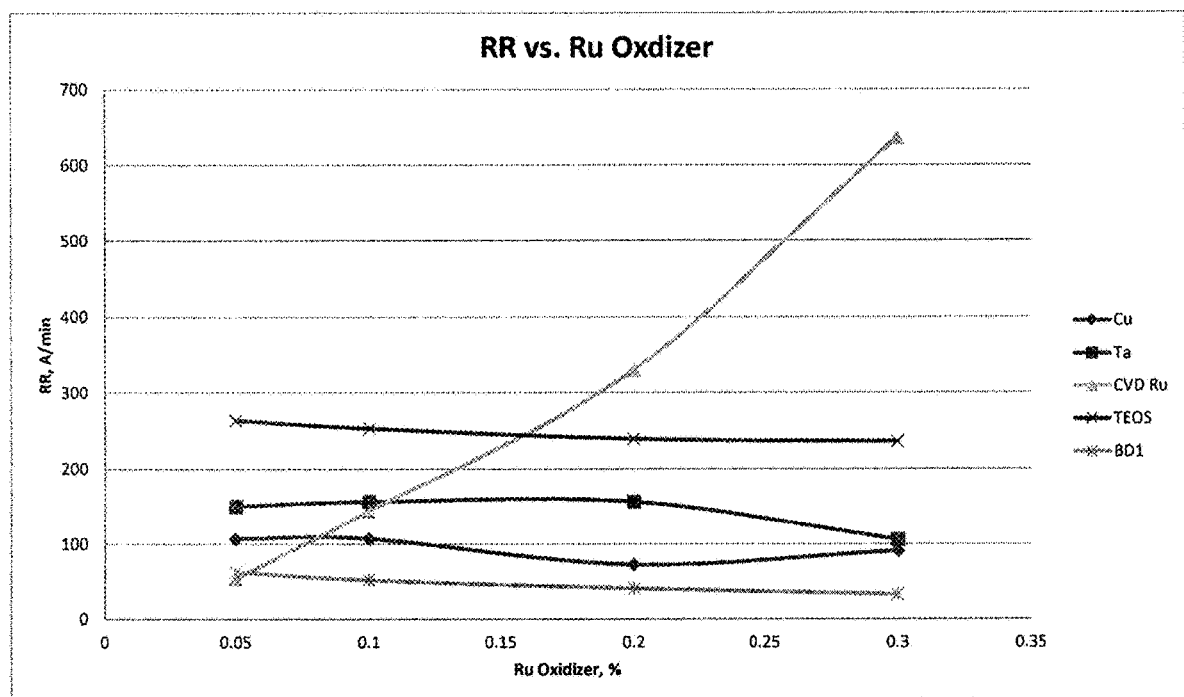

BARRIER RUTHENIUM CHEMICAL MECHANICAL POLISHING SLURRY

CROSS-REFERENCED APPLICATION

This application claims priority to U.S. Provisional Application No. 62/649,324, filed on Mar. 28, 2018, which is incorporated herein by reference in its entirety.

BACKGROUND

1. Field of the Disclosure

The present disclosure provides chemical mechanical polishing (CMP) slurry that is advantageous for polishing ruthenium materials, at a high selectivity with respect to copper. In particular, the CMP slurries of the present disclosure comprise, in part, a synergistic combination of a hydroxide pH adjustor, an oxygenated halogen compound, which may be a perhaolgenate or a halogen peroxy acid, and a halogen alkyl benzotriazole.

2. Description of the Related Art

In back-end-of-line (BEOL) applications in the semiconductor industry, ruthenium is often used as a liner material. Unlike some other materials, such as cobalt, ruthenium is relatively chemically stable and thus does not deteriorate. It also has favorable deposition properties. However, ruthenium can be hard to remove during CMP processes. Further, ruthenium is often used in conjunction with copper, which is a relatively soft material and thus easy to remove. Copper is essential to the function of many semiconductor devices, so if a CMP slurry is used that too easily strips away or damages copper layers or inlays, it can adversely affect the performance of the finished device.

There is a need for a CMP slurry that balances the ability to remove ruthenium at sufficiently high rates, while still protecting any copper in the same semiconductor device.

SUMMARY

In one embodiment, the present disclosure provides a CMP slurry that comprises a combination of an alkali hydroxide, an oxygenated halogen compound (e.g., a perhaolgenate or a halogen peroxy acid), and a halogen alkyl benzotriazole. The slurry may also comprise abrasives, acids, stabilizers, and removal rate enhancers.

In another aspect, embodiments disclosed herein relate to polishing slurry concentrates for use on ruthenium and copper materials, including: an alkali hydroxide; an oxygenated halogen; a halogen alkyl benzotriazole; an abrasive; and an acid, wherein the slurry exhibits a polishing selectivity ratio of ruthenium to copper that is greater than about 1.2.

In yet another aspect, embodiments disclosed herein relate to polishing slurry concentrates for use on ruthenium and copper materials, including: potassium hydroxide, present in an amount of about 0.01 wt % to about 10 wt %, based on the total weight of the slurry; hydrogen periodate, present in an amount of about 0.01 wt % to about 10 wt %, based on the total weight of the slurry; chloro methyl benzotriazole, present in an amount of about 0.001 wt % to about 10 wt %, based on the total weight of the slurry; silica, present in an amount of about 0.01 wt % to about 12 wt %, based on the total weight of the slurry; and malonic acid, present in an amount of about 0.01 wt % to about 10 wt %, based on the total weight of the slurry, wherein the slurry exhibits a polishing selectivity ratio of ruthenium to copper that is greater than 2.5.

In yet another aspect, embodiments disclosed herein relate to polishing slurry concentrates for use on ruthenium and copper materials, including: a pH adjuster; a ruthenium oxidizer; a copper corrosion inhibitor; an abrasive; and a removal rate enhancer, wherein the slurry exhibits a polishing selectivity ratio of ruthenium to copper that is greater than about 1.2.

In yet another aspect, embodiments disclosed herein relate to methods for polishing and removing ruthenium from a semiconductor device including: applying a chemical mechanical polishing slurry concentrate to said layered semiconductor device, said slurry including: a pH adjuster; a ruthenium oxidizer; a copper corrosion inhibitor; an abrasive; and a removal rate enhancer, wherein the slurry exhibits a polishing selectivity ratio of ruthenium to copper that is greater than about 1.2; and polishing said semiconductor device with a rotating polishing pad.

BRIEF DESCRIPTION OF THE DRAWINGS

FIG. 1 shows a plot of removal rates of various materials as a function of the amount of ruthenium oxidizer in the slurry of the present disclosure.

DETAILED DESCRIPTION

The CMP slurries of the present disclosure address the problem of polishing and removing ruthenium material from a layered semiconductor device, at a satisfactorily high rate, while still protecting any copper layers that are on the device. Stated another way, the present CMP slurries show a high selectivity for polishing ruthenium relative to copper. The CMP slurries of the present disclosure comprise a combination of an alkali hydroxide, such as potassium hydroxide, an oxygenated halogen compound, such as periodate, and a halogen alkyl benzotriazole, such as chloro methyl benzotriazole (CMBTA). As discussed in greater detail below, these CMP slurries exhibit a high removal rate and selectivity in polishing ruthenium when compared to copper, for example selectivities of 1.2 or higher, 2.5 or higher, and 3.0 and higher.

These favorable selectivity ratios are unexpected based on the properties of the individual components themselves. As discussed in greater detail below, compositions having benzotriazole (BTA) alone, or even alkyl benzotriazole compounds, have comparatively low selectivities of ruthenium to copper. It is only with the addition of the halogen group, as in the halogen alkyl benzotriazoles of the present disclosure, that the selectivity of ruthenium to copper significantly increases. Without being bound by theory, it is believed that the halogen group makes the halogen alkyl benzotriazole compounds more stable, and therefore they do not oxidize as quickly as BTA or alkyl benzotriazoles do. The halogen may also make the halogen alkyl benzotriazole molecule larger, and thus increase the thickness of the passivation layer on the substrate that is being polished. The passivation layer thus becomes more hydrophobic, which enables it to block the etching or corrosive chemicals present in water passing through the layer, and protect any copper surfaces better.

The halogen alkyl benzotriazole of the present disclosure serves as a corrosion inhibitor for copper. The halogen in this compound can be any from the known halogen class, such as but not limited to chlorine, bromine, or iodine. The alkyl group can be methyl, ethyl, propyl, isopropyl, butyl, isobutyl, or any combinations thereof. The alkyl group may also be one or more having carbon chains from one to 12 carbons. In one embodiment, the compound is chloromethyl-benzotriazole (CMBTA). The halogen alkyl benzotriazole compound can be present in an amount of 0.001 wt % to 10 wt %, based on the total weight of the slurry, or any subranges therebetween. The halogen alkyl benzotriazole compound can also be present in an amount of 0.001 wt % to 1 wt %, based on the total weight of the slurry, or any subranges therebetween. The amount of halogen alkyl benzotriazole should be set by balancing the following considerations. As discussed in greater detail below, more of the compound will lead to a higher ruthenium to copper selectivity polishing ratio. However, when too much halogen alkyl benzotriazole is used, it can leave residue behind on the surface of the polished wafer, which is undesirable.

The oxygenated halogen compound of the present disclosure serves as an oxidizer for ruthenium. When ruthenium oxide is formed, it can be removed by mechanical action of the abrasive. The halogen can be any from the known group, such as but not limited to iodine, bromine, or chlorine. In one embodiment, the oxygenated halogen compound is hydrogen periodate, which has the chemical formula $HIO_4$ (meta form) or $H_5IO_6$ (ortho form). Other suitable compounds include hydrogen bromate, or hydrogen chlorate. The oxygenated halogen compound can be present in an amount of 0.01 wt % to 10 wt %, based on the total weight of the slurry, or any subranges therebetween. The oxygenated halogen compound can also be present in an amount of 0.01 wt % to 1 wt %, based on the total weight of the slurry, or any subranges therebetween.

The alkali hydroxide can serve as a pH adjuster in the slurry. The importance of the pH with respect to the slurry performance is discussed in greater detail below. The alkali can be any from the known alkali group. In one embodiment, the alkali hydroxide is potassium hydroxide. The alkali hydroxide can be present in an amount of 0.01 wt % to 10 wt %, based on the total weight of the slurry, or any subranges therebetween. The alkali hydroxide can also be present in an amount of 0.01 wt % to 1 wt %, based on the total weight of the slurry, or any subranges therebetween.

The slurry of the present disclosure also includes abrasives. The abrasives can be selected from the group consisting of alumina, silica, titania, ceria, zirconia, co-formed products thereof, or mixtures thereof. The abrasive can be present in an amount of 0.01 wt % to 12 wt %, based on the total weight of the slurry, or any subranges therebetween. The abrasive can also be present in an amount of 0.01 wt % to 6 wt %, based on the total weight of the slurry, or any subranges therebetween.

The slurry of the present disclosure also includes at least one acid, which may serve as a removal rate enhancer. In one or more embodiments, the acids of the present disclosure can be selected from the group of carboxylic acids, or mixtures of multiple carboxylic acids. In one or more embodiments, the acids may also be one or more of amino acids, organic or inorganic sulfonic acids, organic or inorganic phosphoric acids and organic phosphonic acids. Examples of organic sulfonic acids include 1,2-Ethanedisulfonic acid, 4-amino-3-hydroxy-1-naphthalenesulfonic acid, 8-Hydroxyquinoline-5-sulfonic Acid, Aminomethanesulfonic acid, Benzenesulfonic Acid, Hydroxylamine O-Sulfonic Acid, Methanesulfonic Acid, m-Xylene-4-sulfonic Acid, Poly(4-styrenesulfonic acid), Polyanetholesulfonic acid, P-Toluenesulfonic Acid, and Trifluoromethane-sulfonic acid. Examples of organic phosphoric acids include ethyl phosphoric acid, cyanoethyl phosphoric acid, phenyl phosphoric acid and vinyl phosphoric acid. Examples of organic phosphonic acids include Poly(vinylphosphonic acid), 1-Hydroxyethane-1,1-diphosphonic Acid, Nitrilotri(methylphosphonic acid), Diethylenetriaminepentakis (methylphosphonic acid), N,N,N'N'-Ethylenediaminetetrakis(methylene phosphonic acid), n-Hexylphosphonic acid, Benzylphosphonic Acid and phenylphosphonic acid. In more specific embodiments, the acid may be at least one selected from the group including, malonic acid, propionic acid, organic sulfonic acids, or mixtures thereof. The acid can be present in an amount of 0.01 wt % to 10 wt %, based on the total weight of the slurry, or any subranges therebetween. The acid can also be present in an amount of 0.01 wt % to 1 wt %, based on the total weight of the slurry, or any subranges therebetween.

In one or more embodiments, the slurry of the present disclosure may also include a surfactant, which may serve as a low-K removal rate inhibitor. In one or more embodiments, the slurry can include a cationic, anionic, non-ionic, amphoteric surfactant or a mixture thereof. In more specific embodiments, the composition includes a non-ionic surfactant. In one or more embodiments, the non-ionic surfactant may be an alkoxylated alcohol non-ionic surfactant that includes a hydrophobic section and an alkoxylated alcohol section. In some embodiments, the alkoxylated alcohol section of the non-ionic surfactant may include ethylene oxide groups, propylene oxide groups, or mixtures thereof. In some embodiments, the hydrophobic section of the non-ionic section may include a linear or branched hydrocarbon group containing from 3 to 20 carbons, or any subranges therebetween. When present, the surfactant can be in an amount of 0.01 wt % to 10 wt %, based on the total weight of the slurry, or any subranges therebetween. The surfactant may also be present in an amount of 0.01 wt % to 1 wt %, based on the total weight of the slurry, or any subranges therebetween.

In one or more embodiments, the pH of the slurry may range from 5 to 11, or from 6 to 11, or any subranges therebetween. However, it may be beneficial for the pH of the slurry to be set in an alkaline range, as this may lead to a lower removal rate of copper. Thus, in some embodiments the pH can be from 7 to 11, or any subranges therebetween, or from 8.5 to 10.5, or any subranges therebetween.

The general slurry composition of the present disclosure is summarized in Table 1 below.

TABLE 1

| Component | Weight % | Component functions |
| --- | --- | --- |
| Alkali hydroxide | 0.01 to 10 | pH adjuster |
| Acid | 0.01 to 10 | Removal Rate Enhancer |
| Abrasive | 0.01 to 12 | Abrasive |
| Oxygenated Halogen | 0.01 to 10 | Ruthenium Oxidizer |
| Halogen Alkyl benzotriazole | 0.001 to 10 | Cu Corrosion Inhibitor |
| Optional Surfactant (ppm wt, net) | 0.001 to 10 | Low-K Removal Rate inhibitor |

In one or more embodiments, the slurry of the present disclosure may include less than 1%, or less than 0.1% by weight of other additives/components not listed in Table 1 and described previously in the present application with respect to each component. In one or more embodiments, the slurry of the present disclosure consists of only the components listed in Table 1 and described previously in the present application with respect to each component, and water. For example, in some embodiments, the slurries of the present disclosure may specifically exclude one or more of the following additive components, or any combinations thereof. Such components are selected from the group consisting of polymers having a molecular weight of greater than 1000 g/mol, or in some embodiments greater than 2000 g/mol, oxygen scavengers, quaternary ammonium salts (including quaternary ammonium hydroxides such as TMAH), amines, bases such as NaOH and LiOH, surfactants other than a defoamer, a defoamer, fluoride containing compounds, silicates, hydroxycarboxylic acids containing more than two hydroxyl groups, carboxylic and polycarboxylic acids lacking amino groups, silanes (e.g., alkoxysilanes), cyclic compounds (e.g., non-halogenated azoles (such as diazoles, triazoles, or tetrazoles), triazines, and cyclic compounds containing at least two rings, such as substituted or unsubstituted naphthalenes, or substituted or unsubstituted biphenylethers), buffering agents, non-azole corrosion inhibitors, and metal salts (e.g., metal halides).

EXAMPLES

Examples are provided to further illustrate the capabilities of the polishing compositions and methods of the present disclosure. The provided examples are not intended and should not be construed to limit the scope of the present disclosure.

For all examples, an Applied Materials Mirra CMP polisher was used with a downforce of 1.5 psi and a flow rate of 175 mL/min to polish SKW CVD Ru wafers.

Table 2 below shows removal rate data for copper, tantalum, ruthenium (deposited via chemical vapor deposition, or CVD), tetra-ethyl-ortho-silicate (TEOS), and Black Diamond®, which is a carbon doped CVD silicon dioxide (BD1) for a variety of polishing compositions. The amount of CMBTA is varied to show how the amount affects the ruthenium to copper polishing rate selectivity. There are also comparative example compositions including BTA and methyl benzotriazole, which illustrate that the halogen alkyl benzotriazole of the present disclosure, in this case CMBTA, dramatically improves the ruthenium to copper selectivity.

All compositions have the same amount of alkali hydroxide (KOH), acid (malonic), abrasive (silica), and oxygenated halogen (periodate). The pH values are roughly equal as well. The amount of CMBTA is varied. As is shown in the data, the control composition has no BTA of any kind. The removal rate of ruthenium with this composition is high or at least satisfactory, as are the removal rates of the other materials. However, without any CMBTA in the control composition, there is nothing to protect the copper. The removal rate of copper in the control is very high comparatively, and the ruthenium to copper selectivity is thus very poor, less than 1.

By contrast, in Ex 1 through Ex 4, the higher the amount of CMBTA, the lower the removal rate for copper, while the ruthenium removal rate remains relatively constant, leading to better ruthenium to copper selectivity. This is a surprising result because compositions that include BTA (CE 1) and methyl benzotriazole (CE 2), instead of CMBTA, are shown to not protect copper nearly as well. For example, Ex 3, CE 1, and CE 2 each have 600 parts per million of CMBTA, BTA, and methyl benzotriazole, respectively. As noted above, all other values are the same. Yet, CE 1, with BTA, removes copper at a rate of almost four times that of Ex 3. CE 2, with methyl benzotriazole, removes copper at a rate of more than double that of Ex 3. Clearly, the CMBTA protects copper much better than the non-halogenated benzotriazole compounds, which was not expected. CMBTA also does not adversely affect the removal rate of other substrates (e.g., Ta, TEOS, and BD1) significantly, and in fact improves the removal rate in some cases.

Table 3 shows more data illustrating the novel and unexpected effects of the slurries of the present disclosure. In the seven compositions shown below, CMBTA is again compared to BTA and methyl benzotriazole. The amount of the ruthenium oxidizer, the oxygenated halogen, is also varied.

TABLE 2

|  | Control | Ex 1 | Ex 2 | Ex 3 | Ex 4 | CE 1 | CE 2 | Ex 5 |
| --- | --- | --- | --- | --- | --- | --- | --- | --- |
| KOH (% wt, net) | 0.3750 | 0.3750 | 0.3750 | 0.3750 | 0.3750 | 0.3750 | 0.3750 | 0.3750 |
| Malonic Acid (% wt, net) | 0.1333 | 0.1333 | 0.1333 | 0.1333 | 0.1333 | 0.1333 | 0.1333 | 0.1333 |
| $SiO_2$ (% wt, net solids) | 4.00 | 4.00 | 4.00 | 4.00 | 4.00 | 4.00 | 4.00 | 4.00 |
| $H_5IO_6$ (% wt, net) | 0.17 | 0.17 | 0.17 | 0.17 | 0.17 | 0.17 | 0.17 | 0.17 |
| BTA (ppm wt, net) |  |  |  |  |  | 600 |  |  |
| 5-methyl benzotriazole (ppm wt, net) |  |  |  |  |  |  | 600 |  |
| Chloro-Methyl benzotriazole (ppm wt, net) |  | 200 | 400 | 600 | 800 |  |  | 800 |
| Alkoxylated Alcohol (ppm wt, net) |  |  |  |  |  |  |  | 500 |
| POU pH | 9.65 | 9.65 | 9.66 | 9.65 | 9.66 | 9.65 | 9.67 | 9.66 |
| Cu RR (A/min): | 291 | 208 | 126 | 101 | 82 | 374 | 228 | 92 |
| Ta RR (A/min): | 174 | 206 | 218 | 206 | 192 | 185 | 188 | 193 |
| CVD Ru RR (A/min): | 252 | 249 | 240 | 252 | 256 | 245 | 249 | 255 |
| TEOS RR (A/min): | 344 | 350 | 374 | 388 | 382 | 385 | 376 | 378 |
| BD1 RR (A/min): | 810 | 712 | 740 | 799 | 805 | 785 | 732 | 150 |
| Ru/Cu RR selectivity | 0.87 | 1.20 | 1.90 | 2.50 | 3.12 | 0.66 | 1.09 | 2.77 |

TABLE 3

| | Ex 6 | CE 3 | CE 4 | Ex 7 | Ex 8 | Ex 9 | Ex 10 |
|---|---|---|---|---|---|---|---|
| Ru oxidizer ($H_5IO_6$), % | 0.17 | 0.17 | 0.17 | 0.05 | 0.1 | 0.2 | 0.3 |
| KOH (% wt, net) | 0.29 | 0.29 | 0.29 | 0.29 | 0.29 | 0.29 | 0.29 |
| Organic Sulfonic acid (% wt, net) | 0.31 | 0.31 | 0.31 | 0.31 | 0.31 | 0.31 | 0.31 |
| Chloro-Methyl benzotriazole (ppm wt, net) | 250 | | | 250 | 250 | 250 | 250 |
| BTA (ppm wt, net) | | 250 | | | | | |
| methyl benzotriazole (ppm wt, net solids) | | | 250 | | | | |
| $SiO_2$ (% wt, net solids) | 4.00 | 4.00 | 4.00 | 4.00 | 4.00 | 4.00 | 4.00 |
| RR, A/min | | | | | | | |
| Cu | 105 | 322 | 207 | 107 | 107 | 73 | 91 |
| Ta | 156 | 130 | 122 | 150 | 156 | 156 | 106 |
| CVD Ru | 219 | 225 | 214 | 54 | 144 | 330 | 636 |
| TEOS | 254 | 232 | 252 | 264 | 253 | 239 | 236 |
| BD1 | 134 | 99 | 110 | 63 | 52 | 41 | 33 |
| Ru/Cu RR Selectivity | 2.09 | 0.70 | 1.03 | 0.50 | 1.35 | 4.52 | 6.99 |

Ex 6, CE 3, and CE 4 show similar results to what is described above in Table 2, except at 250 parts per million instead of 600. Namely, CMBTA protects copper much better than BTA or methyl benzotriazole, and does not adversely affect ruthenium removal rates.

Ex 7 through Ex 10 show removal rate date for varying amounts of the ruthenium oxidizer periodate. The removal rate of ruthenium is very high at higher amounts of periodate, while the removal rate of copper stays low, or even drops. This data is shown graphically in FIG. 1.

While the present disclosure has been described with reference to one or more exemplary embodiments, it will be understood by those skilled in the art that various changes may be made and equivalents may be substituted for elements thereof without departing from the scope of the present disclosure. In addition, many modifications may be made to adapt a particular situation or material to the teachings of the disclosure without departing from the scope thereof. Therefore, it is intended that the present disclosure not be limited to the particular embodiment(s) disclosed as the best mode contemplated, but that the disclosure will include all embodiments falling within the scope of the appended claims.

What is claimed is:

1. A polishing composition for use on ruthenium and copper materials, comprising:
   an alkali hydroxide;
   an oxygenated halogen, wherein the oxygenated halogen compound comprises at least one halogen selected from the group consisting of: iodine, bromine, chlorine, and any combinations thereof, and wherein the oxygenated halogen is present in an amount of about 0.1 wt % to about 10 wt %, based on the total weight of the composition;
   a halogen alkyl benzotriazole, present in an amount of about 0.001 wt % to about 0.08 wt %, based on the total weight of the composition;
   an abrasive; and
   an acid,
   wherein the composition exhibits a polishing selectivity ratio of ruthenium to copper that is greater than about 1.2.

2. The composition of claim 1, wherein the alkali hydroxide is potassium hydroxide.

3. The composition of claim 1, wherein the alkali hydroxide is present in an amount of about 0.01 wt % to about 10 wt %, based on the total weight of the composition.

4. The composition of claim 3, wherein the alkali hydroxide is present in an amount of about 0.01 wt % to about 1 wt %, based on the total weight of the composition.

5. The composition of claim 1, wherein the oxygenated halogen is hydrogen periodate.

6. The composition of claim 1, wherein the halogen alkyl benzotriazole comprises at least one halogen selected from the group consisting of: chlorine, bromine, iodine, and any combinations thereof.

7. The composition of claim 1, wherein the alkyl in the halogen alkyl benzotriazole is one selected from methyl, ethyl, propyl, isopropyl, butyl, isobutyl, or any combination thereof.

8. The composition of claim 1, wherein the halogen alkyl benzotriazole is chloro methyl benzotriazole.

9. The composition of claim 1, wherein the halogen alkyl benzotriazole is present in an amount of about 0.005 wt % to about 0.08 wt %, based on the total weight of the composition.

10. The composition of claim 1, wherein the abrasive is at least one selected from the group consisting of: alumina, silica, titania, ceria, zirconia, co-formed products thereof, and any combinations thereof.

11. The composition of claim 10, wherein the abrasive is silica.

12. The composition of claim 11, wherein the abrasive is present in an amount of about 0.01 wt % to about 12 wt %, based on the total weight of the composition.

13. The composition of claim 12, wherein the abrasive is present in an amount of about 0.01 wt % to about 6 wt %, based on the total weight of the composition.

14. The composition of claim 1, wherein the acid is at least one acid selected from the group consisting of: carboxylic acids, amino acids, sulfonic acids, phosphoric acids, phosphonic acids, and any combination thereof.

15. The composition of claim 14, wherein said sulfonic acid is at least one organic sulfonic acid selected from the group consisting of: 1,2-ethanedisulfonic acid, 4-amino-3-hydroxy-1-naphthalenesulfonic acid, 8-hydroxyquinoline-5-sulfonic acid, aminomethane sulfonic acid, benzenesulfonic acid, hydroxylamine o-sulfonic acid, methanesulfonic acid, m-xylene-4-sulfonic acid, poly(4-styrenesulfonic acid), polyanetholesulfonic acid, p-toluenesulfonic acid, and trifluoromethane-sulfonic acid.

16. The composition of claim 14, wherein said phosphoric acid is at least one organic phosphoric acid selected from the group consisting of: ethyl phosphoric acid, cyanoethyl phosphoric acid, phenyl phosphoric acid and vinyl phosphoric acid.

17. The composition of claim 14, wherein said phosphonic acid is at least one organic phosphonic acid consisting of: poly(vinylphosphonic acid), 1-hydroxyethane-1,1-diphosphonic acid, nitrilotri(methylphosphonic acid), diethylenetriaminepentakis (methylphosphonic acid), N,N,N'N'-ethylenediaminetetrakis(methylene phosphonic acid), n-hexylphosphonic acid, benzylphosphonic acid and phenylphosphonic acid.

18. The composition of claim 1, wherein the acid is at least one acid selected from the group consisting of: malonic acid, propionic acid, an organic sulfonic acid, and any combinations thereof.

19. The composition of claim 1, wherein the acid is present in an amount of about 0.01 wt % to about 10 wt %, based on the total weight of the composition.

20. The composition of claim 1, wherein the acid is present in an amount of about 0.01 wt % to about 1 wt %, based on the total weight of the composition.

21. The composition of claim 1, further comprising a low-K removal rate inhibitor.

22. The composition of claim 21, wherein said low-K removal rate inhibitor is a surfactant.

23. The composition of claim 22, wherein said surfactant is at least one surfactant selected from the group consisting of: cationic surfactants, anionic surfactants, non-ionic surfactants, and amphoteric surfactants.

24. The composition of claim 23, wherein the surfactant is an alkoxylated alcohol non-ionic surfactant.

25. The composition of claim 24, wherein the surfactant is present in an amount of about 0.01 wt % to about 10 wt %, based on the total weight of the composition.

26. The composition of claim 25, wherein the surfactant is present in an amount of about 0.01 wt % to about 1 wt %, based on the total weight of the composition.

27. The composition of claim 1, wherein the pH of the composition is from about 5 to about 11.

28. The composition of claim 27, wherein the pH of the composition is from about 7 to about 11.

29. The composition of claim 1, wherein the composition exhibits a polishing selectivity ratio of ruthenium to copper that is greater than 2.5.

30. A polishing composition concentrate for use on ruthenium and copper materials, comprising:
   potassium hydroxide, present in an amount of about 0.01 wt % to about 10 wt %, based on the total weight of the composition;
   hydrogen periodate, present in an amount of about 0.1 wt % to about 10 wt %, based on the total weight of the composition;
   chloro methyl benzotriazole, present in an amount of about 0.001 wt % to about 0.08 wt %, based on the total weight of the composition;
   silica, present in an amount of about 0.01 wt % to about 12 wt %, based on the total weight of the composition; and
   malonic acid, present in an amount of about 0.01 wt % to about 10 wt %, based on the total weight of the composition,
   wherein the composition exhibits a polishing selectivity ratio of ruthenium to copper that is greater than 2.5.

31. A polishing composition concentrate for use on ruthenium and copper materials, comprising:
   a pH adjuster;
   a ruthenium oxidizer, wherein the ruthenium oxidizer comprises at least one halogen selected from the group consisting of: iodine, bromine, chlorine, and any combinations thereof, and wherein the ruthenium oxidizer is present in an amount of about 0.1 wt % to about 10 wt %, based on the total weight of the composition;
   a copper corrosion inhibitor comprising a halogen alkyl benzotriazole, present in an amount of about 0.001 wt % to about 0.08 wt %, based on the total weight of the composition;
   an abrasive; and
   a removal rate enhancer,
   wherein the composition exhibits a polishing selectivity ratio of ruthenium to copper that is greater than about 1.2.

32. The polishing composition according to claim 31, further comprising a low-K removal rate inhibitor.

* * * * *